(12) United States Patent
Lee

(10) Patent No.: US 6,228,210 B1
(45) Date of Patent: *May 8, 2001

(54) SURFACE WAVE COUPLED PLASMA ETCHING APPARATUS

(75) Inventor: Cheol-kyu Lee, Yongin (KR)

(73) Assignee: Samsung Electronics Co., Ltd., Kyungki-do (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/295,629

(22) Filed: Apr. 20, 1999

(30) Foreign Application Priority Data

Apr. 20, 1998  (KR) .................................. 96-14068

(51) Int. Cl.[7] .......................... H05H 1/00; H01L 21/3065
(52) U.S. Cl. ................. 156/345; 118/723 MW; 204/298.38
(58) Field of Search .................. 156/345; 118/723 MW, 118/723 ME; 207/298.38

(56) References Cited

U.S. PATENT DOCUMENTS 5,034,086 * 7/1991 Sato ....................................... 156/345
5,951,887 * 9/1999 Mabuchi et al. ...................... 156/345

OTHER PUBLICATIONS

Oxide Etching Using Surface Wave Coupled Plasma, Jpn. J. Appl. Phys., vol. 33, Part 1, No. 12B pp. 7037–41, Dec. 1994.
Reactive Ion Etching Lag On High Rate Oxide Etching Using High Density Plasma, J. Vac. Sci. Technol. B 13(6). pp. 2390–2393, Nov./Dec. 1995.
High Aspect Contact Fabrication using High Density Plasma, Dry Process Symposium, pp. 361–366 (1997).

* cited by examiner

Primary Examiner—Thi Dang
(74) Attorney, Agent, or Firm—Skjerven Morrill MacPherson LLP; David W. Heid

(57) ABSTRACT

A surface wave coupled plasma etching apparatus according to the present invention can produce a plasma within a confined area above an etching object by a microwave confinement plate, so as to prevent an upper portion of the apparatus from being sputtered by the plasma. The microwave confinement plate is interposed between a pair of glass plates, so that the microwave confinement plate is not exposed to and sputtered by the plasma during an etching process. The lower glass plate which protects the microwave confinement plate from the plasma is formed so as not to change a temperature of itself rapidly when the etching stops, and thereby an undesirable polymer adhesion to the lower glass plate is avoided.

8 Claims, 2 Drawing Sheets

SURFACE WAVE COUPLED PLASMA ETCHING APPARATUS

BACKGROUND OF THE INVENTION

1. Field of the Invention

The present invention relates to an etching apparatus for fabricating a semiconductor device, and more particularly, to a surface wave coupled plasma etching apparatus.

2. Description of the Related Art

As semiconductor wafers become larger, there has been an increasing need for semiconductor fabrication apparatuses capable of processing the large wafers. Particularly, an etching apparatus capable of forming a plasma over a large area is required to form uniform fine patterns having critical dimensions on the wafer.

A surface wave coupled plasma etching apparatus, which is disclosed in "Oxide etching using surface wave coupled plasma", Jpn. J. Appl. Phys. Vol. 33 (1994) pp. 7037–7041, by Takeshi Akimoto, Eiji Ikawa, Toshiaki Sango, Kyouichi Komachi, Katuo Katayama and Tosiki Ebata, is proposed to provide uniform plasma etching of large wafers. The surface wave coupled plasma etching apparatus uniformly generates a plasma over a large area by a microwave (2.45 GHz) excitation. The microwave is introduced into the surface wave coupled plasma etching apparatus through a dielectric plate, for instance, a polymer plate into an etching chamber confined by a grounded metal, upper electrode.

A conventional surface wave coupled plasma etching apparatus typically applies a high power radio frequency signal to a lower electrode, and thus the plasma etches the upper metal electrode as well as the semiconductor wafer. Accordingly, metal particles from the upper metal electrode contaminate the semiconductor wafer and can cause a failure of the semiconductor wafer etching.

SUMMARY OF THE INVENTION

In accordance with an embodiment of the present invention, a surface wave coupled plasma etching apparatus can be divided into an upper portion which emits a microwave and a lower portion which performs an etching. The upper portion includes a microwave supplying unit, a dielectric plate, upper and lower glass plates, a microwave confinement plate and a microwave guide. The dielectric plate is placed horizontally in the upper portion and connected to the microwave supplying unit. The upper and lower glass plates are spaced apart from and parallel to the dielectric plate. The microwave confinement plate is interposed between the upper and lower glass plates. The microwave guide covers an outer surface of the dielectric plate, and sidewalls of the upper glass plate and the microwave confinement plate. The lower portion includes an etching chamber, and a chamber wall of the chamber supports the upper portion.

Preferably, the dielectric plate is formed of a fluorocarbon polymer, and the upper and lower glass plates are formed of a material, such as quartz of which can resist rapid temperature change when an etching process starts and stops. Particularly, the lower glass plate should be thick enough to avoid the sudden temperature change. A buffer layer is also provided to enhance adhesion between the microwave confinement plate and the upper and lower glass plates.

The etching chamber includes a lower electrode on which an etching object is loaded and a radio frequency power supply connected to the lower electrode. It is preferred that the chamber walls have a sufficient area to provide a ground to a radio frequency power applied by the radio frequency power supply.

The present invention can prevent a plasma sputtering of the microwave confinement plate by interposing the microwave confinement plate between the upper and lower glass plates, and thus avoid a contamination of the etching object.

BRIEF DESCRIPTION OF THE DRAWINGS

The present invention will become more apparent by describing embodiments thereof with reference to the attached drawings in which.

Use of same reference symbols in different figures indicates similar or identical items.

DESCRIPTION OF THE PREFERRED EMBODIMENTS

Figure 1:
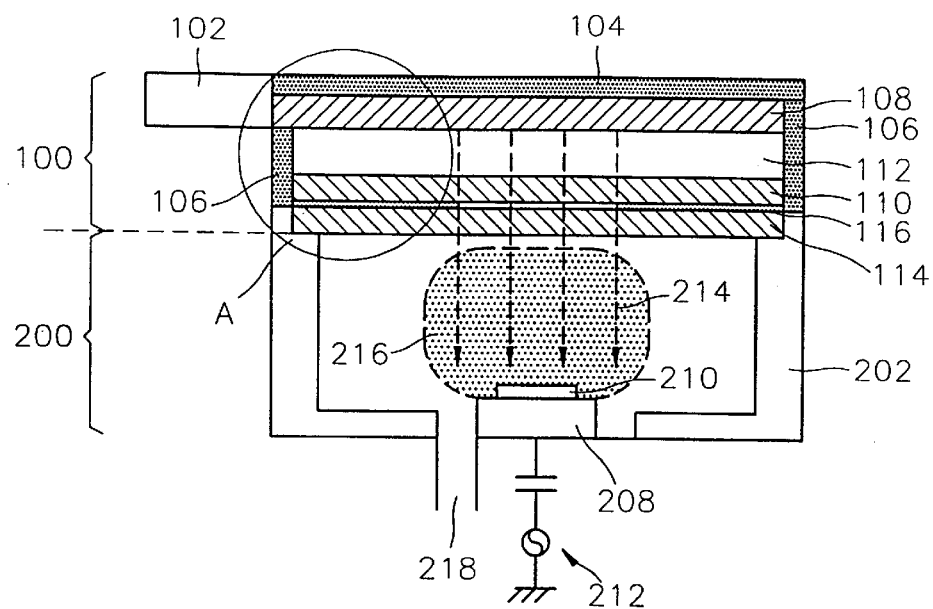
FIG. 1 is a sectional view of a surface wave coupled plasma etching apparatus according to an embodiment of the present invention.
Figure 2:
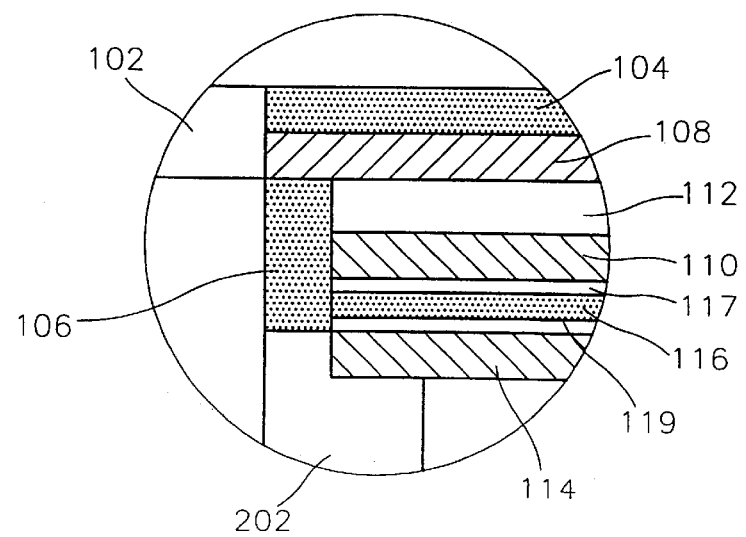
FIG. 2 is an enlarged sectional view of region A of FIG. 1.

With reference to FIGS. 1 and 2, a surface wave coupled plasma etching apparatus according to an embodiment of the present invention generates a plasma by a microwave (2.45 GHz) excitation in the absence of a magnetic field, so that the plasma performs an etching. The apparatus can be divided into an upper portion 100 and a lower portion 200. Upper portion 100 emits and confines microwaves. Lower portion 200 includes an etching chamber for the etching process using the plasma formed by the microwaves coming from upper portion 100.

Upper portion 100 includes a microwave supplying unit 102, microwave guides 104 and 106, a dielectric plate 108, an upper glass plate 110, a lower glass plate 114 and a microwave confinement plate 116.

Microwave supplying unit 102 is installed outside the top of one end of the upper portion 100. Microwave supplying unit 102 supplies and introduces microwaves into the surface wave coupled plasma etching apparatus. Dielectric plate 108, which connects to microwave supplying unit 102, is placed horizontally at an upper part of upper portion 100. Dielectric plate 108 receives the microwaves and emits the microwaves. Dielectric plate 108 is typically formed of a fluorocarbon polymer, e.g., Teflon.

Microwave guides 104 and 106 cover a top surface of dielectric plate 108, and side surfaces of dielectric plate 108, upper glass plate 110 and microwave confinement plate 116, so as to introduce the microwaves into lower portion 200, that is, the etching chamber. Thus, in order to prevent the microwaves from piercing through microwave guides 104 and 106, microwave guides 104 and 106 are formed of a metal, preferably, an aluminum plate or an anodized aluminum plate.

Upper glass plate 110 is spaced apart from dielectric plate 108, and a space 112 between dielectric plate 108 and upper glass plate 110 is filled with air. Lower glass plate 114 is parallel to upper glass plate 110. Upper glass plate 110 and lower glass plate 114 couple the microwaves between dielectric plate 108 and lower region 200 which is under vacuum. Upper glass plate 110 and lower glass plate 114 are formed of a heat resistant material that can avoid a drastic temperature change when an etching process starts or ends, e.g., a quartz, which does not change temperature rapidly as the etching process is started or stopped. Particularly, lower glass plate 114 should be thick enough to avoid the drastic temperature change and thus an adsorption of polymers produced from the etching to lower glass plate 114.

Microwave confinement plate 116 confines the microwaves emitted from dielectric plate 108 to a region corresponding to an etching object 210 so that a plasma forms only above etching object 210. Thus, microwave confinement plate 116 is formed of a metallic plate that has an opening that allows the emitted microwaves only into the region above etching object 210. The metallic plate should not be pierced through by the microwaves. Accordingly, microwave confinement plate 116 is preferably formed of an aluminum or anodized aluminum plate.

Buffer layers 117 and 119 are further provided between microwave confinement plate 116 and upper and lower glass plates 110 and 114 to enhance adhesion between microwave confinement plate 116 and upper and lower glass plates 110 and 114. Preferably, buffer layers 117 and 119 are TiN or Ta layers.

Lower portion 200 includes a chamber wall 202, a lower electrode 208, a radio frequency power supply 212 and an outlet 218. Chamber wall 202 forms an etching chamber and supports upper portion 100. It is preferable that chamber wall 202 have an area large enough to provide a ground with respect to a radio frequency power applied from radio frequency power supply 212. Lower electrode 208 on which etching object 210 is loaded is installed on a bottom surface of the etching apparatus, facing dielectric plate 108 and connecting to radio frequency power supply 212. Thus, the radio frequency power is applied to lower electrode 208.

An etching method using the surface wave coupled plasma etching apparatus of FIG. 1 is described. Dielectric plate 108 receives microwaves from microwave supplying unit 102 and emits microwaves toward lower portion 200. Then, microwave confinement plate 116 allows the emitted microwaves to enter lower region 200 only through the opening of microwave confinement plate 116. Incident microwaves 214 entering into lower region 200 excite an etching gas to generate a plasma 216. Plasma 216 etches etching object 210 loaded on lower electrode 208. The radio frequency power applied to lower electrode 208 controls an energy of plasma 216 incident on etching object 210. Plasma 216 remaining after the etching is exhausted through outlet 218.

Figure 3:
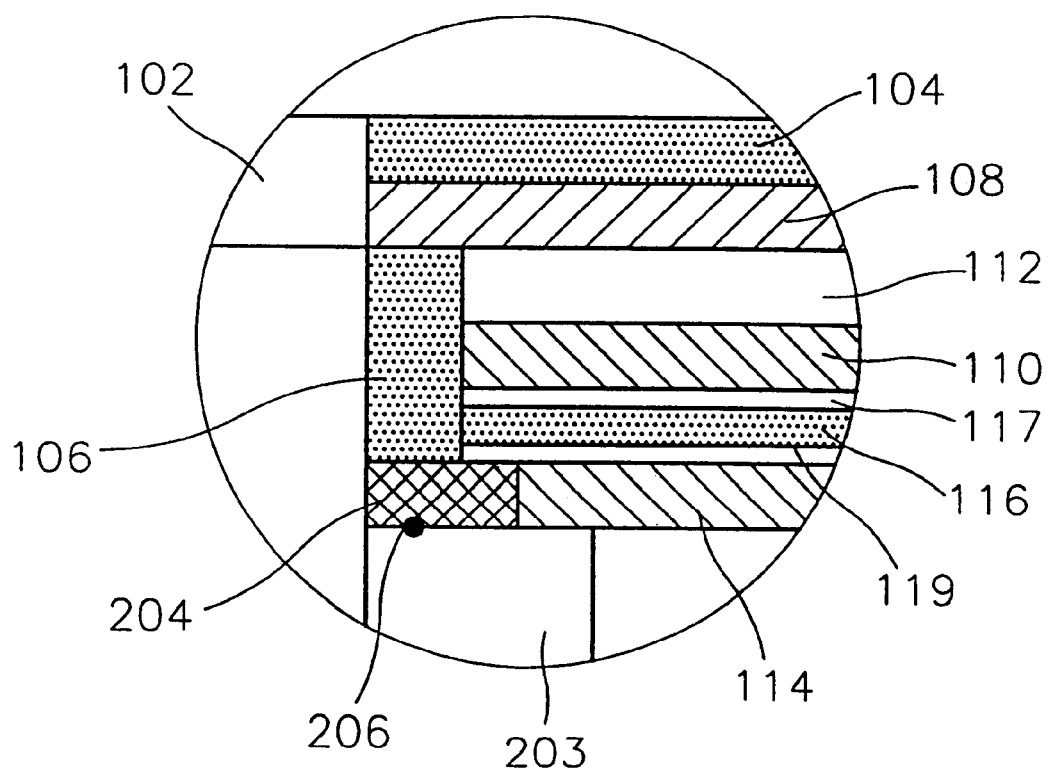
FIG. 3 is an enlarged sectional view of a region of a surface wave coupled plasma etching apparatus according to another embodiment of the present invention.

FIG. 3 is an enlarged sectional view of a region of a surface wave coupled plasma etching apparatus according to another embodiment of the present invention.

The apparatus is different from the apparatus of FIG. 1 in that a support portion 204 supports microwave guides 106, upper glass plate 110 and microwave confinement plate 116, and an O-ring 206 is between a chamber wall 203 and support portion 204. Chamber wall 203 supports lower glass plate 114. Other elements are the same as those of the apparatus of FIG. 1. Support portion 204 can improve a sealing between chamber wall 203 and support portion 204 by O-ring 206, and a vacuum in the chamber.

Following illustrations explains advantages of the present invention. First, when an etching was performed after removing an upper electrode from a surface wave coupled plasma etching apparatus disclosed in the paper by Takeshi Akimoto et al, supra, to prevent a plasma from sputtering the upper electrode, the contamination due to metal particles caused by sputtering the upper electrode was solved, but the plasma eroded an upper portion of a chamber wall. Accordingly, there is a need for confining the plasma only to an etching region.

Second, in order to prevent the upper electrode from being exposed to the plasma, a 2-mm thick quartz plate was placed on an upper electrode surface exposed to the plasma in the surface wave coupled plasma etching apparatus disclosed in the paper by Takeshi Akimoto et al, supra. The quartz plate prevented the plasma from sputtering the upper electrode. However, the temperature of the quartz plate changed from 280 to 70° C. when the etching stopped, and due to the drastic temperature change, polymers from the etching adhered to the quartz plate. Accordingly, in order to prevent the polymer adhesion, the quartz plate should be capable of avoiding the drastic temperature change when the etching stops.

Third, an etching was performed using the surface wave coupled plasma etching apparatus of FIG. 1. The confinement plate is equivalent to the upper electrode mentioned in above two experiments. As a result, the microwave confinement plate confined the plasma only above an etching object, and thereby prevented the sputtering of an upper portion of a chamber. In addition, because the lower glass plate protected the confinement plate, metal contamination particles were not produced from the confinement plate. Also, the lower glass plate was thick enough to avoid the drastic temperature and thus the polymer adhesion when etching stops.

In summary, a surface wave coupled plasma etching apparatus according to the present invention can produce a plasma within a confined area above an etching object by a microwave confinement plate, so as to prevent an upper portion of the apparatus from being sputtered by the plasma. The microwave confinement plate is interposed between a pair of glass plates, so that the microwave confinement plate is not exposed to and sputtered by the plasma during an etching process. The lower glass plate which protects the microwave confinement plate from the plasma is formed so as not to change a temperature of itself rapidly when the etching stops, and thereby an undesirable polymer adhesion to the lower glass plate is avoided.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A surface wave coupled plasma etching apparatus comprising:
    an upper portion comprising:
        a microwave supplying unit which supplies microwaves into the apparatus;
        a dielectric plate which connects to the microwave supplying unit,;
        upper and lower glass plates spaced apart from the dielectric plate and installed parallel to the dielectric plate;
        a microwave confinement plate interposed between the upper and lower glass plates; and
        a microwave guide formed on an outer surface of the dielectric plate and on sidewalls of the upper glass plate and the microwave confinement plate; and
    a lower portion which comprises an etching chamber.

2. The apparatus of claim 1, wherein the dielectric plate is a fluorocarbon polymer plate.

3. The apparatus of claim 1, wherein the upper and lower glass plates are formed of a material that has a high heat containing capability, so that a temperature of the upper and lower glass plates does not change rapidly as an etching proceeds and stops.

4. The apparatus of claim 3, wherein the material is a quartz.

5. The apparatus of claim 3, wherein the lower glass plate is formed to a thickness that can avoid a rapid temperature change as the etching proceeds and stops.

6. The apparatus of claim 1, wherein the microwave confinement plate is a metal plate.

7. The apparatus of claim 1, further comprising buffer layers capable of enhancing adhesion between the microwave confinement plate and the upper glass plate, and between the microwave confinement plate and the lower glass plate.

8. The apparatus of claim 1, wherein the lower portion further includes:

a lower electrode on which an etching object is loaded; and a radio frequency power supply connected to the lower electrode, wherein the chamber wall has a sufficient area to function as a ground with respect to a radio frequency power applied by the radio frequency power supply.

* * * * *